United States Patent [19]
Kimura

[11] Patent Number: 5,107,322
[45] Date of Patent: Apr. 21, 1992

[54] WIRING OR CONDUCTOR INTERCONNECT FOR A SEMICONDUCTOR DEVICE OR THE LIKE

[75] Inventor: Masakazu Kimura, Suwa, Japan

[73] Assignee: Seiko Epson Corporation, Japan

[21] Appl. No.: 410,936

[22] Filed: Sep. 22, 1989

[30] Foreign Application Priority Data

Nov. 10, 1988 [JP] Japan .................................. 63-284686

[51] Int. Cl.$^5$ ............................................. H01L 27/02
[52] U.S. Cl. ......................................... 357/51; 357/59; 357/23.1; 365/154
[58] Field of Search .................... 357/23.1, 23.5, 59 F, 357/51; 365/154, 182

[56] References Cited

U.S. PATENT DOCUMENTS 4,805,147  2/1989  Yamanaka et al. .................. 365/154
4,853,894  8/1989  Yamanaka et al. .................. 365/154

FOREIGN PATENT DOCUMENTS 130461  8/1982  Japan .
61-283161  12/1986  Japan .................................. 357/59 F

OTHER PUBLICATIONS

Y. Sakai, "CMOS-SRAM Process Device Technology", *28th Semiconductor Training Course, Institute of Electronics, Information & Communication Engineers*, pp. 69-114, Aug., 1987.
N. Tamba et al., "An 8ns 256K Bi CMOS RAM", 1988 *IEEE International Solid State Circuits Conference*, pp. 184-185, Feb. 18, 1988.
T. Yamanaka et al., "A 25 µm$^2$, New Poly-Si PMOS Load (PPL) SRAM Cell Having Excellent Error Immunity", IEDM 88, pp. 48-51, 1988.
H. Shimada et al., "18 ns 1 Mbit CMOS SRAM", 1988 *Conference of Electronics, Information & Communication Engineers*, pp. 23-28, May 26, 1988.
A. Hirose et al., "1 Mbit CMOS SRAM", *Mitsubishi Electronics Technical Report*, vol. 62(6), pp. 81-84, Jun., 25, 1988.
T. Kamatsu et al., "35 ns 1 Mbit CMOS SRAM", 1987 *Conference of Institute of Electronics, Information & Communication Engineers*, pp. 43-48, Apr. 21, 1987.
"The Advent of 1M SRAM", *Nikkei Microdevices*, pp. 53-65, Mar. 1987.
T. Wada, et al "14 ns 1Mbit CMOS SRAM", 1988 *Conference of Institute of Electronics, Information & Communication Engineers*, pp. 29-35, May 26, 1988.

*Primary Examiner*—Andrew J. James
*Assistant Examiner*—Courtney A. Bowers
*Attorney, Agent, or Firm*—W.Douglas Carothers, Jr.

[57] ABSTRACT

A wiring or conductor structure for an integrated circuit structure of a semiconductor device is designed to provide for extended values in integrated passive components, for example, resistance values in a memory cell of a high resistance load type static RAM. Extended values of high resistance polycrystalline silicon resistances formed in conductor films are achieved by effectively increasing the length of the films and, therefore, the regions of resistance without changing or increasing the size or scale of the semiconductor device. This is accomplished by employing double wiring or conductor layers which are electrically connected permitting a lateral extension of the integrated and patterned resistance region in at least one of the wiring layers while retaining or further reducing the integration scale of the active and passive components comprising the integrated circuit structure.

7 Claims, 5 Drawing Sheets

WIRING OR CONDUCTOR INTERCONNECT FOR A SEMICONDUCTOR DEVICE OR THE LIKE

BACKGROUND OF THE INVENTION

This invention relates generally to an electrical wiring or conductor interconnect structure for a semiconductor device, integrated circuit or the like and in particular to a combination electrical wiring and passive element in an integrated circuit structure of a semiconductor device, such as, in a high resistance load type static RAM (SRAM) with a wiring interconnect including an integrated resistance for connection between a voltage source and a diffusion layer representing a terminal domain of an integrated active element, e.g., a MOSFET source or drain.

It is known in the prior art to provide integrated buried wiring interconnections in the fabrication of integrated circuits, such as, for example in the case of high resistance load type static RAM's or SRAM. One such example is disclosed in Japanese Patent Laid Open No. 130461/1982 and is exemplified in FIGS. 3 and 4. In order to fully appreciate the present invention, it is first desirable to discuss the state of the art relative to wiring interconnects in conventional high resistance polycrystalline silicon load type memory cells in order to better understand and appreciate the improvements brought about by the present invention. FIG. 4 illustrates the schematic representation of a conventional high resistance polycrystalline silicon load type memory cell comprising a flip flop for storing information with an output of one of two inverters, comprising series connected MOSFET $Q_1$ and resistance $R_1$ and series connected MOSFET $Q_2$ and resistance $R_2$, with each inverter connected as an input to the other. These flip flop circuits are combined with two switching MOSFETS's $Q_3$ and $Q_4$ connected to the write line (WL) for exchanging information externally of the cell via data lines DL and bar DL.

FIG. 3 illustrates a cross sectional portion of the integrated circuit structure for the storage FF circuit schematic shown in FIG. 4. The structure comprises a p-type silicon substrate upon which are formed regions of field insulating film 2, e.g., $SiO_2$, beneath which are formed p-type channel stopper domains 3 to prevent the formation of parasitic channels. A gate insulating film 4, for example $SiO_2$, is provided on the surface of each active element domain comprising $Q_1$ through $Q_4$, which domains are surrounded by field insulating film 2. Active domains shown in the FIG. 3 cross section disclose only MOSFET's $Q_1$ and $Q_3$.

A word line of predetermined form comprises a double layer film of polycrystalline silicon film 5 and high temperature or fusing point metal silicide or polycide film 6, which form gate electrode 7 and the gate for MOSFET $Q_3$ bounded by side walls 11. These films are directly deposited on gate insulating film 4 and field insulating film 2. An n+-type source domain 9 and n+-type drain domain 10 are formed relative to each active element comprising a MOSFET, and are surrounded by field insulating film 2, and are in alignment with a word line, WL, gate electrode 7 and grounding conductor SL.

An interlayer insulating film 12, for example $SiO_2$, is deposited over the double layer films 5, 6 and MOSFET's $Q_1$ and $Q_3$. A first contact hole 16 is then formed in interlayer insulating film 12 and thereafter a wiring layer 15 comprising a polycrystalline silicon film of predetermined form is deposited thereon. Wiring layer 15 includes n+-type polycrystalline regions 15A and 15B and high resistance polycrystalline silicon resistances $R_1$, $R_2$ wherein, as seen in FIG. 3, only $R_2$ is visible. Region $R_1$ or $R_2$ comprise an intrinsic polycrystalline silicon film 15C, which is integral with regions 15A and 15B of n+-type polycrystalline film and all together form wiring layer 15. Next, a second interlayer insulating film 17, for example, a PSG film, is formed on wiring layer 15 followed by the deposition of data lines DL and bar DL (only line DL is visible in FIG. 3). Data lines DL and bar DL are connected respectively to drain domains 10 of MOSFET's $Q_3$ and $Q_4$ via the formed contact hole 21, as shown relative to $Q_3$ in FIG. 3.

Resistance $R_1$, $R_2$ may be formed as follows. Wiring layer 15 is first deposited as a nondoped or intrinsic polycrystalline silicon film over the surface of interlayer insulating film 12. Next, a portion of the deposited intrinsic polycrystalline silicon film to function as a high resistance polycrystalline silicon resistance is covered by a masking layer and the remaining portions of layer 15 are exposed to a diffusion process with an impurity, such as, phosphorous (P) or arsenic (As) and ion implantation or other type of incorporation method. The masking layer is then removed, producing a polycrystalline silicon film 15 having a pattern of predetermined form comprising wiring or conductor sections 15A and 15B of n+ polycrystalline Si film, enhanced in conductivity by introduction of phosphorous or arsenic, and high resistance, intrinsic polycrystalline silicon regions 15C forming resistance $R_1$ and $R_2$.

Under present practice, the sizes of the polycrystalline silicon resistances $R_1$ and $R_2$ are determined by the spatial relation between contact hole 16 and power source $V_{DD}$ at the other end of wiring layer 15. Thus, as best illustrated in FIG. 4, resistances $R_1$, $R_2$ are connected to the source domains of MOSFET's $Q_1$ through $Q_4$ via wiring layer 15. The other ends of resistances $R_1$, $R_2$ are connected to power source $V_{DD}$. The drains of MOSFET's $Q_1$ and $Q_2$ are connected to ground. Word line, WL, is connected to the gate electrodes of MOSFET's $Q_3$ and $Q_4$ and data lines DL and bar DL are connected to the drains of MOSFET's $Q_3$ and $Q_4$ via contact hole 21.

There remains, however, a problem in connection with the above described memory cell structure in that a refined construction and reduction in integrated circuit scale is not realizable. This problem is exemplified in the disclosure of Yoshio Sakai, "CMOS-SRAM Process Device Art", 28th Semiconductor Special Course Draft, pp. 69-114, wherein it is explained, that as the size of resistances $R_1$ and $R_2$ are shortened to refine the scale of the transistor structure, their resistance values become rapidly low. This is illustrated in the diagram of FIG. 5. Therefore, a desired high resistance value is difficult to obtain or retain since resistance values will be naturally reduced in value with any reduction in the integrated circuit scale. As a result, in the particular case of a SRAM, the consumption current during standby will accordingly increase. Therefore, a certain reasonable size, currently about 3 microns or more, is necessary, which is a big obstacle toward the realization of a refined memory cell construction and a reduction in memory cell scale. Further, it is presently believed that, in the future, the size of such a memory cell will be governed by the required sizes of the resistance $R_1$ and $R_2$ and, as a result, this problem of scale will become even more intensified.

SUMMARY OF THE INVENTION

According to this invention, interconnect means is provided to extend values for integrated passive elements, such as resistances $R_1$ and $R_2$ in a SRAM explained above, while also maintaining the desired integrated circuit scale. This means is achieved by employing double wiring or conductor layers which are electrically connected and designed to permit an extension of the integrated and patterned resistance region while retaining or further reducing the original integrated circuit scale.

In particular, wiring or conductor interconnect means comprising this invention extends the value of an integrated passive electrical component coupled to other passive or active electrical elements in an integrated circuit, the extended value provided without any change in or allowing for a reduction in the scale of integration among the passive or active electrical elements. The interconnect means comprises at least two wiring or conductor layers separated by an insulating layer and laterally extended relative to the electrical elements to a permissible extremity wherein the conductor layers are electrically coupled through the insulating layer whereby a tiered formation of these layers is formed with adjacent tiers thereof being coupled at one elongated extremity thereof. This configuration provides at least one extended wiring length, which is provided to include the desired integrated passive electrical component, whereby the magnitude of the integrated passive electrical component is extended because of the extended conductor length. The interconnect means of this invention is particularly suited for application in an integrated circuit of a memory cell in a high resistance load type static RAM or SRAM, in which case the passive electrical component in the extended wiring length comprises a resistance having an enlarged resistance value due to the designed lateral extension of the wiring layer.

Advantages obtainable through the employment of this invention are:

1. Resistances, or other such passive elements capable of being selectively deposited, diffused or implanted or the like, can be formed in integrated fashion in circuit conductor interconnects between active element domains, for example, in a memory cell configuration, which are extended and, therefore, higher resistance values can be realized without increasing memory cell size. This accomplished by shifting the contact hole relative to the circuit wiring layers so that the longitudinal extent of the resistance element can be enlarged. Thus, the integrated circuit area of a memory cell can be minimized and an enhancement of integration density may be accordingly achieved without any sacrifice of required resistance value.

2. Since a wiring layer capacity will correspondingly be increased by the method of manufacturing of this invention, the static RAM semiconductor device will be strengthened against the so called alpha ray soft error wherein alpha rays penetrate the semiconductor substrate causing undesirable potential fluctuations in the semiconductor device.

3. A satisfactory high resistance value can be readily and easily obtained without unconventional or complex processing techniques.

4. A SRAM semiconductor device will be stable with less consumption current, particularly during the time of standby operation.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Figure 1A:
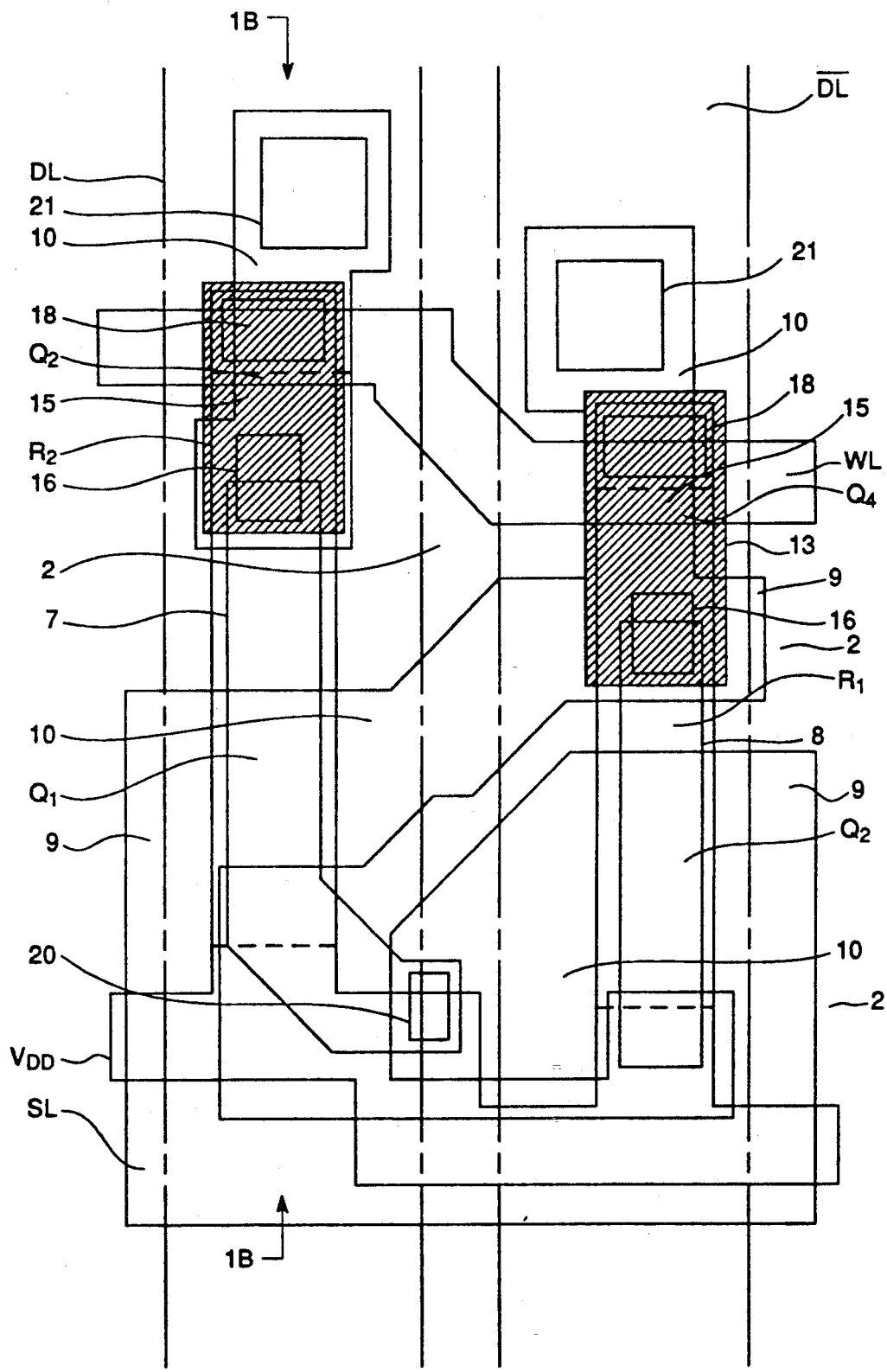
FIG. 1A is a plan view of an integrated circuit structure of a semiconductor device comprising an embodiment of this invention.

Since like reference numerals denote like components in different views of the drawings relative to both the prior art structure and the structure of the present invention, their description will not be repeated in great detail here.

Figure 1B:
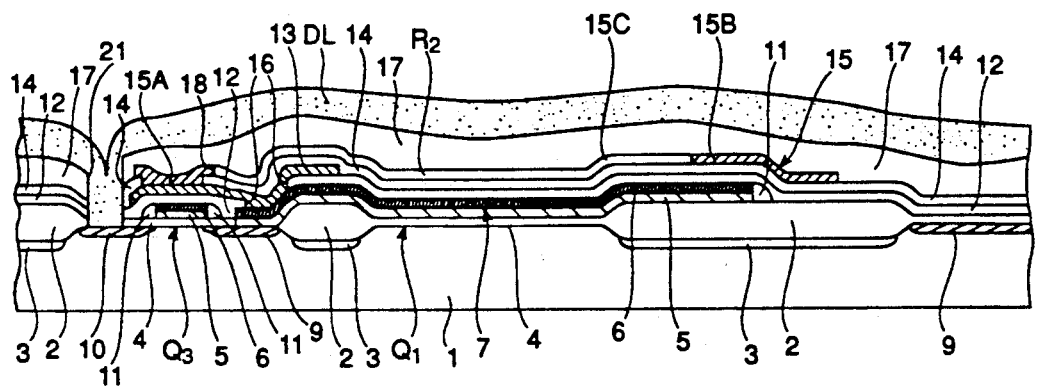
FIG. 1B is a cross sectional view taken along the line 1B—1B of FIG. 1A relative to one embodiment of this invention.

FIG. 1A is a plan view of a static RAM memory cell comprising an embodiment of this invention and FIG. 1B is a sectional view thereof. As shown in FIG. 1B, a field insulating film 2 is deposited on the surface of semiconductor substrate 1. Elements making up the circuit are electrically isolated by field insulating film 2. A p-type channel stopper domain 3 is provided beneath film 2. A gate insulating film 4 is provided on the surface of each active element domain surrounded by field insulating film 2. A word line, WL, of predetermined form comprises a double layer film of poly silicon film 5 and silicide or polycide film 6 (which form gate electrodes 7, 8) and grounding conductor, SL, (source domain 9), which electrode films are deposited on gate insulating film 4, field insulating film 2 and a portion of formed source domain 9. Grounding conductor, SL, comprises a diffusion layer formed in substrate 1. The $n^+$-type source domain 9 and $n^+$-type drain domain 10 are previously formed in each active element region surrounded by field insulating film 2 in alignment with word line, WL, gate electrodes 7, 8 and grounding conductor, SL. Switching MOSFET's $Q_3$, $Q_4$ comprise word line, WL, source domain 9 and drain domain 10; MOSFET Q1 comprises gate electrode 7, drain domain 10 and source domain 9; and MOSFET $Q_2$ comprises gate electrode 8, source domain 9 and drain domain 10.

Drain domain 10 of MOSFET $Q_1$ and source domain 9 of MOSFET $Q_4$ are common. MOSFET's $Q_1$ through $Q_4$ also contain a LDD (Lightly Doped Drain) structure. Source domain 9 and drain domain 10 are formed by introducing impurities in semiconductor substrate 1 in two separate stages for forming side wall 11 comprising, for example $SiO_2$, on the side of word line, WL, and gate electrodes 7, 8.

An interlayer insulating film 12 is provided over MOSFET's $Q_1$ and $Q_2$. A first contact hole 16 is formed in interlayer insulating film 12 and then a first wiring layer 13 comprising n+-type polycrystalline silicon film of predetermined form, illustrated in FIG. 1B, is formed on film 12. Next, a second interlayer insulating film 14 is formed over the first interlayer insulating film 12 over MOSFET's $Q_1$ and $Q_2$. A second contact hole 18 is then formed in the second interlayer insulating film 14 over which is provided a second wiring layer 15 consisting of n+-type polycrystalline silicon regions 15A and 15B of a predetermined form and high resistance polycrystalline silicon region 15C. First wiring layer 13 and second wiring layer 15 are electrically connected through second contact hole 18. Accordingly, second wiring layer 15 is connected to source domain 9 of MOSFET's $Q_3$ and $Q_4$ via second contact hole 18 provided in second insulating film 14 and adjacent the end of double film 5, 6 comprising electrode 7.

The sheet resistance for n+-type polycrystalline silicon regions 15A and 15B will be, for example, about 150 ohms per square or smaller for a second wiring layer 15 having a thickness of about 100 nm.

Figure 3:
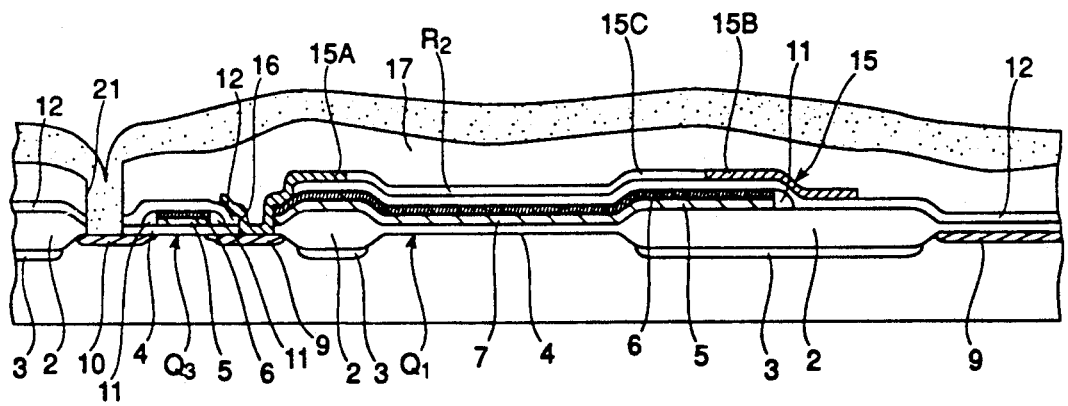
FIG. 3 is a sectional view showing an integrated circuit structure of a portion of a conventional high resistance polycrystalline silicon semiconductor load type memory cell.
Figure 4:
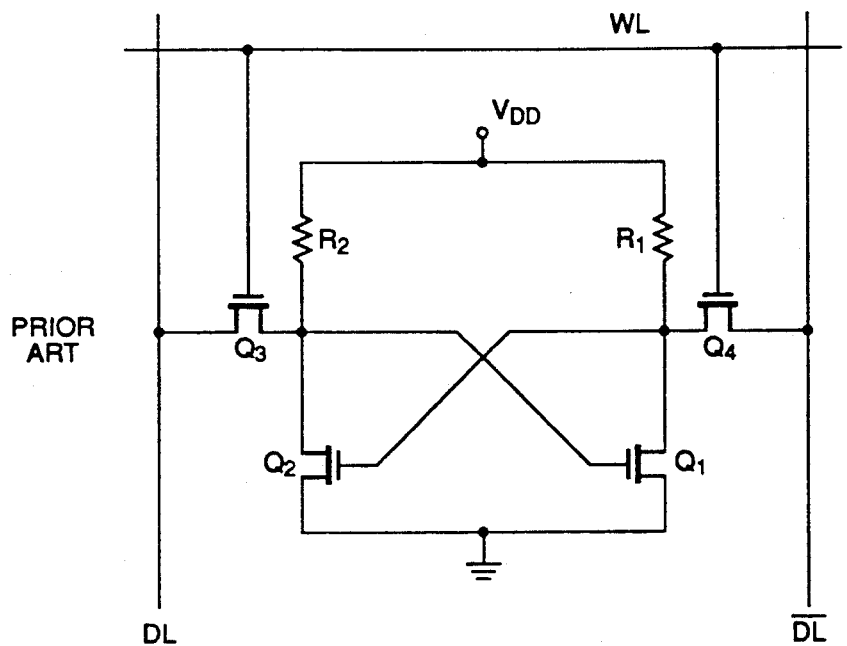
FIG. 4 is a schematic circuit diagram of a conventional high resistance polycrystalline silicon load type memory cell shown in part in FIG. 3.
Figure 5:
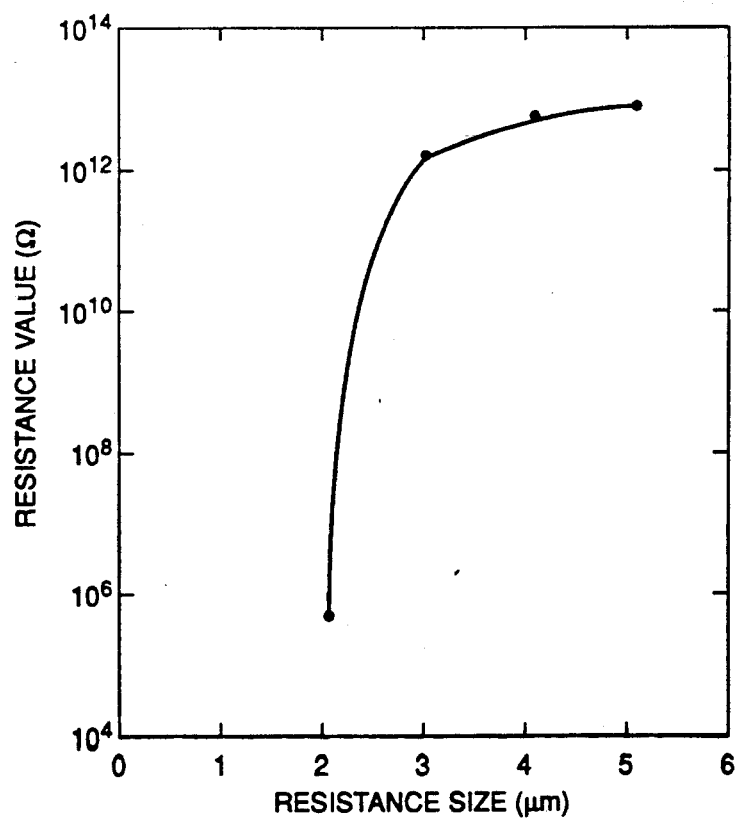
FIG. 5 is a graphic illustration of the relation between measured high resistance polycrystalline silicon resistance sizes in microns and corresponding resistance values in ohms as measured by the inventor herein.

Under present practice, relative sizes of the high resistance polycrystalline silicon resistances $R_1$, $R_2$ of regions 15C are determined according to the interval spacing between the first contact hole 16 and power source $V_{DD}$ as exemplified in FIG. 3. However, in the present invention, high resistance polycrystalline silicon resistances $R_1$, $R_2$ are formed through first wiring layer 13 to an extended second wiring layer 15, as illustrated in FIG. 1B, thereby determining the extent and, therefore, the value of resistances $R_1$, $R_2$ according to an interval spacing between the position of second contact hole 18 and power source $V_{DD}$. Accordingly, the relative sizes of resistances $R_1$, $R_2$ can be increased by the additional interval spacing between first contact hole 16 and second contact hole 18 without increasing the length or size of the memory cell, i.e., without increasing the length between MOSFET's $Q_1$ and $Q_3$, while achieving a required high resistance value for both resistances $R_1$, $R_2$. The increase in resistance value without change to the memory cell configuration is of significant importance in the light of the requirement for a refined construction which is realized by the approach of this invention. This approach leads to a decrease in current consumption of the static RAM during its standby mode. Also, since the area of the memory cell can be minimized while retaining large resistance values for $R_1$ and $R_2$, an increase in integration density of the memory chip is therefore possible.

A third interlayer insulating film 17, for example a PSG film, is then deposited over second wiring layer 15 and resistances $R_1$, $R_2$. Then, data lines DL and bar DL, each comprising an aluminum film, are deposited on interlayer insulating film 17. These data lines DL and bar DL are then connected respectively to drain domains 10 of MOSFET $Q_3$ and MOSFET $Q_4$ via contact holes 21 provided in gate insulating film 4, interlayer insulating film 12, second interlayer insulating film 14, and third interlayer insulating film 17.

Figure 1C:
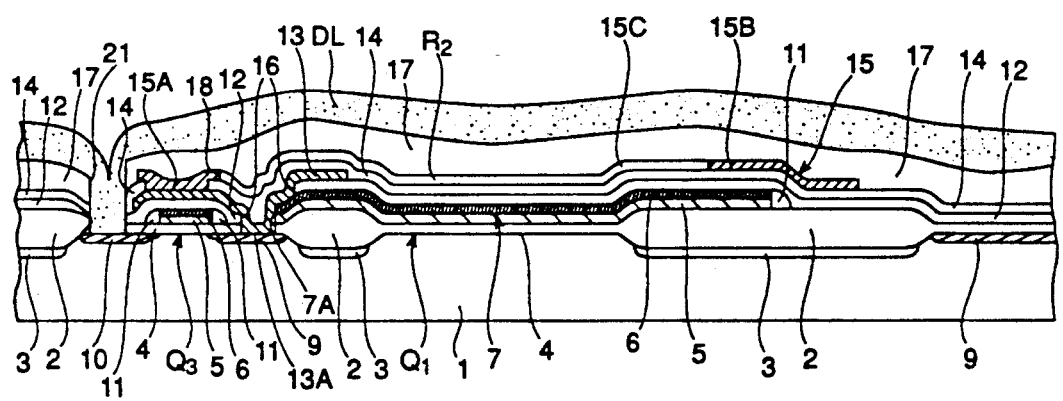
FIG. 1C is a cross sectional view taken along the line 1B—1B of FIG. 1A relative to another embodiment of this invention.

Reference is now made to FIG. 1C comprising another embodiment of this invention. The FIG. 1C embodiment is substantially identical to the FIG. 1B embodiment and, therefore, like reference numerals denote the same components in each embodiment and the description for FIG. 1B is equally applicable to FIG. 1C. In FIG. 1C, however, first contact hole 16 is extended through insulating layer 12 so that the subsequent deposit of first wiring layer 13 is extended past the ends of electrode layers 5, 6 to be in direct surface contact with source domain 9, as indicated at 13A. In this manner, metal layer 13 is in direct contact with a surface portion of layer 6 as well as edges of both layers 5, 6, as indicated at 7A, in addition to direct contact at 13A with source domain 9. In the FIG. 1B embodiment, metal layer 13 is in direct contact with the surface of layer 6 and makes electrical contact to source domain 9 through electrode layers 5, 6.

Figure 2A:
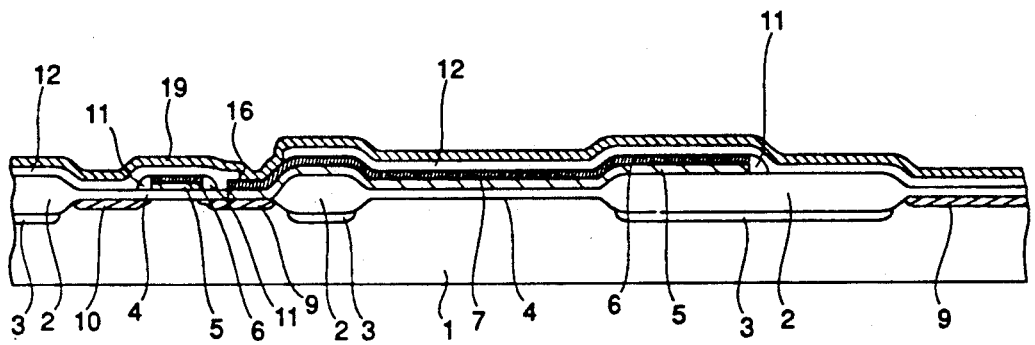
FIGS. 2A, 2B and 2C are cross sectional views of the semiconductor device comprising this invention illustrating in a sequential manner a method of manufacture for the device shown in FIGS. 1A and 1B.

Reference is now made to a fabrication process for the static RAM disclosed in FIGS. 1A and 1B. After MOSFET's $Q_1$ through $Q_4$, word line, WL, grounding conductor, SL, and other components have been formed, as illustrated in FIG. 2A, insulating film 12 is deposited over the foregoing after which first contact hole 16 is formed in film 12 by photoetching. Then, polycrystalline silicon film 19 is formed over the surface, for example, to a thickness of 100 nm or so, via chemical vapor deposition. Next, an impurity, such as P, As or the like, is diffused into film 19 followed by an ion implantation to achieve a low resistance in the film. In the case of ion implantation of a P impurity, for example, an ion implant of about 30 kev with a dose rate at about $6 \times 10^{15}$ cm$^{-2}$ is suitable.

Figure 2B:
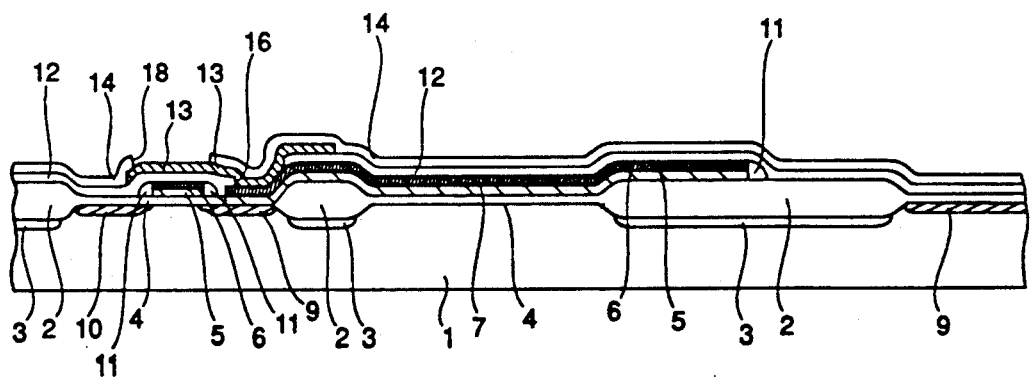

Next, as illustrated in FIG. 2B, polycrystalline silicon film 19 is patterned in a predetermined form through selective photoetching. The patterning is in the direction of word line, WL, (FIG. 1A) from first contact hole 16. Next, second interlayer insulating film 14 is formed over the surface and second contact hole 18 is formed through film 14 by photoetching. Second contact hole 18 is formed, not over first contact hole 16, but laterally in the direction of word line, WL, and laterally beyond the position of hole 16 so that the length and, therefore, correspondingly the resistance values of $R_1$ and $R_2$ can be increased.

Figure 2C:
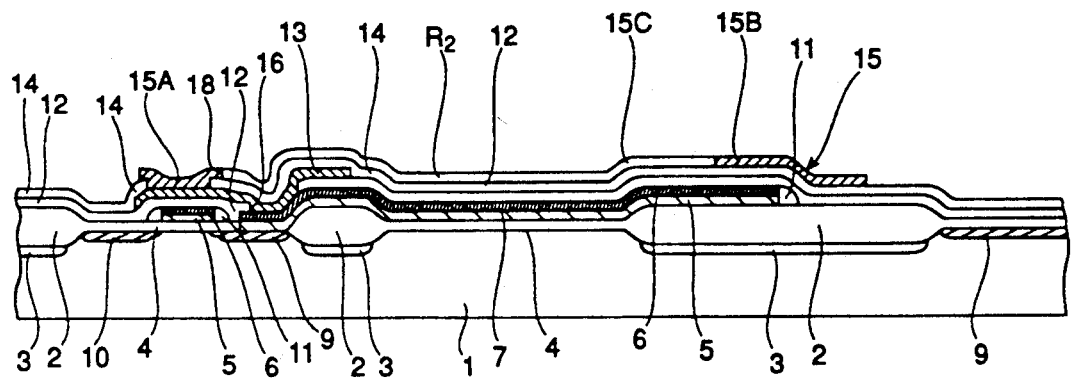

Next, as shown in FIG. 2C, an intrinsic polycrystalline silicon film of relative thin dimension, for example about 50 nm or so, is formed on second interlayer insulating film 14 via chemical vapor deposition. Next, a resist mask layer is provided on a portion 15C of the intrinsic polycrystalline silicon film 14, which will correspond to resistances $R_1$, $R_2$ to be subsequently formed. This is followed with a diffusion of P or As and ion implantation in the exposed regions 15A and 15B thereby maintaining portion 15C of film 14, protected by the resist mask layer, at its existing high resistance value while those portions 15A and 15B exposed to the diffusion and ion implant process are at a low resistance value. Since film 14 is thinner than first wiring layer 13, it is desirable that energy employed for ion implantation of the impurity be of lower value than employed in connection with the treatment of film 19.

After the resist mask layer is removed, polycrystalline silicon layers 20 (FIG. 1A) are patterned into desired form via photoetching resulting in a wiring or conductor layer 15 of predefined dimensions and including conductive regions 15A and 15B and high resistance regions 15C, comprising $R_1$ and $R_2$, with $R_2$ being visible in FIG. 2C. Third interlayer insulating film 17, contact hole 21 and data lines DL and bar DL are thereafter formed, as depicted in FIGS. 1A and 1B, to complete the fabrication of the static RAM. Thus, according to the manufacturing process described above, a static RAM with minimized standby current, $I_{DDS}$, and stable operating characteristics is achieved through a fairly simple fabrication process.

While the invention has been described in conjunction with two embodiments, it is evident to those skilled in the art that many alternatives, modifications, applications and variations will be apparent in light of the foregoing description. For example, the concept of this invention is not limited to passive components in the form of resistances in a SRAM circuit but also is extendable to other passive components capable of being deposited, such as capacitors and inductors, as well as extendable to other types of IC applications.

Also, a high fusing point metallic silicide film may be provided for first wiring layer 13, instead of a polycrystalline silicon film, to provide for the low resistance value portions of the film. In this case, a sheet resistance value of first wiring layer 13 may be decreased to approximately 15 ohms per square or below. As a result, a memory signal delay due to excessive wiring resistance may be prevented or substantially reduced. Since the resistance value is low, the use of this silicide film may also be employed as a wiring layer relative to input/output circuits on an IC chip.

Furthermore, if the high resistance polycrystalline silicon resistances $R_1$, $R_2$ are formed in second wiring layer 15, for example, so as to cross over an end of first wiring layer 13, their crossing will naturally occur at different levels in the circuit. Therefore, the sizes of $R_1$ and $R_2$ may be substantially increased due to the length of increase provided in the intrinsic polycrystalline film deposited between wiring levels 13 and 15. As a result, the resistance values for $R_1$ and $R_2$ may be further increased without any change in the memory cell scale.

Lastly, if first wiring layer 13 or a portion thereof is constructed of an intrinsic silicon film along with all or a portion of second wiring layer 15, then two high resistances connected in series may be realized thereby providing means for obtaining very high resistance values in the IC structure. With respect to the forgoing, it can, therefore, be appreciated that these resistance values may be varied by adding series resistances either laterally in horizontal layers or regions of a semiconductor device or in vertical layers or regions transversely of the deposited layers of the semiconductor device. Also, it can be realized that a serpentine pattern of series resistances included in longitudinally extended conductors separated by insulating layers with conductor ends in adjacent conductors coupled via contact opening in the insulating layer therebetween, which opening is prepared at one extremity of such adjacent conductors.

Thus, the invention described herein is intended to embrace all such alternatives, modifications, applications and variations as fall within the spirit and scope of the appended claims.

What is claimed is:

1. In an integrated circuit,
   interconnect means to extend the value of an integrated passive electrical component coupled to other passive and active electrical elements in said circuit, at least some of said active electrical elements including diffusion regions,
   said extended value provided without any change in or allowing for a reduction in the scale of integration among said electrical elements,
   said interconnect means comprising at least two conductor layers separated by an insulating layer with a second of said conductive layers comprising said integrated passive electrical component formed therein for a substantial length thereof,
   a first of said conductor layers connected at one end through a first contact hole to a diffusion region of at least one of said active electrical elements and laterally extended relative to said one electrical element in a first direction to a permissible extremity wherein the other end of said first conductor layer is electrically coupled to one end of said second conductive layer through said insulating layer via a second contact hole offset from said first contact hole providing a tiered formation of first and second conductor layers coupled at said extremity,
   said first conductor layer providing electrical connection between said one active element and said second layer and said second layer and said integrated passive electrical component having an extended conductor length extending laterally away from said second contact hole in a second direction opposite to said first direction over and insulated from said first contact hole,
   said integrated passive electrical component in said second conductor layer formed in spaced relation from said second contact hole with the magnitude of said integrated passive electrical component extended due to the addition of said extended conductor length.

2. In the integrated circuit of claim 1 wherein said circuit comprises a memory cell in a high resistance load type static RAM, said passive electrical component comprising a resistance wherein the resistance value thereof is increased due to said extended conductor length in said second conductor layer.

3. In a semiconductor device having a memory cell including a transistor formed on a semiconductor substrate and a high resistance load, said semiconductor device comprising a first insulating film formed over said transistor, a first contact hole formed in said first insulating film aligned with an electrode domain of said semiconductor device containing doping impurities, a first wiring layer formed on said first insulating film and connected to said electrode domain through said first contact hole and extended laterally over said first insulating film in a first direction to an extended position, a second insulating film formed on said first wiring layer, a second contact hole formed in said second insulating film aligned with said extended position and thereby laterally offset relative to said first contact hole in said first direction, a second wiring layer comprising an integral resistance region for a substantial length thereof, said second wiring layer formed on said second insulating film and coupled at said extended position to said laterally extended first wiring layer, said second wiring layer and said integral resistance region extending over said second insulating film and said first contact hole in a second direction opposite to said first direction, said integral resistance region formed in said second wiring layer in spaced relation from said second contact hole thereby protected from the possible migration of said impurities from said electrode domain via said first wiring layer into the region of said second contact hole.

4. In the semiconductor device as defined in claim 3 wherein said second wiring layer is extended laterally in said second direction away from said second contact hole and constituting said high resistance load.

5. In the semiconductor device as defined in claim 3 wherein said first wiring layer is connected to said electrode domain via a combination layer comprising a polysilicon film and a silicide film.

6. In the semiconductor device as defined in claim 3 wherein said second wiring layer comprises a polycrystalline silicon layer.

7. In the semiconductor device as defined in claim 3 wherein said second wiring layer resistor means comprises intrinsic silicon.

* * * * *